United States Patent
Russell et al.

(10) Patent No.: US 9,335,629 B2
(45) Date of Patent: May 10, 2016

(54) SELF-ASSEMBLY OF BLOCK COPOLYMERS ON TOPOGRAPHICALLY PATTERNED POLYMERIC SUBSTRATES

(75) Inventors: Thomas P. Russell, Amherst, MA (US); Soojin Park, Ulsan (KR); Dong Hyun Lee, Amherst, MA (US); Ting Xu, Berkeley, CA (US)

(73) Assignees: THE UNIVERSITY OF MASSACHUSETTS, Boston, MA (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 264 days.

(21) Appl. No.: 13/546,378

(22) Filed: Jul. 11, 2012

(65) Prior Publication Data

US 2012/0276346 A1    Nov. 1, 2012

Related U.S. Application Data

(62) Division of application No. 12/553,484, filed on Sep. 3, 2009, now Pat. No. 8,247,033.

(60) Provisional application No. 61/170,707, filed on Apr. 20, 2009, provisional application No. 61/098,253, filed on Sep. 19, 2008.

(51) Int. Cl.
| | |
|---|---|
| *B05D 3/00* | (2006.01) |
| *G03F 7/00* | (2006.01) |
| *B81C 1/00* | (2006.01) |
| *B82Y 10/00* | (2011.01) |
| *B82Y 40/00* | (2011.01) |

(52) U.S. Cl.
CPC .......... *G03F 7/0002* (2013.01); *B81C 1/00031* (2013.01); *B82Y 10/00* (2013.01); *B82Y 40/00* (2013.01); *B81C 2201/0149* (2013.01); *Y10T 428/24802* (2015.01); *Y10T 428/249953* (2015.04)

(58) Field of Classification Search
CPC .................................................... B81C 1/00031
See application file for complete search history.

(56) References Cited

U.S. PATENT DOCUMENTS

| | | |
|---|---|---|
| 3,812,224 A | 5/1974 | Smith et al. |
| 5,079,268 A | 1/1992 | Nelissen et al. |
| 5,314,569 A | 5/1994 | Pribat et al. |
| 5,772,905 A | 6/1998 | Chou |
| 6,635,904 B2 | 10/2003 | Goetz et al. |
| 6,746,825 B2 | 6/2004 | Nealey et al. |

(Continued)

OTHER PUBLICATIONS

Chuang et al., 3-D Self Assembly of Spherical Block Copolymer Domains into V-Shaped Grooves, 2006, vol. 6, No. 10, 2332-2337.*

(Continued)

*Primary Examiner* — Francisco Tschen
(74) *Attorney, Agent, or Firm* — Cantor Colburn LLP

(57) ABSTRACT

Highly-ordered block copolymer films are prepared by a method that includes forming a polymeric replica of a topographically patterned crystalline surface, forming a block copolymer film on the topographically patterned surface of the polymeric replica, and annealing the block copolymer film. The resulting structures can be used in a variety of different applications, including the fabrication of high density data storage media. The ability to use flexible polymers to form the polymeric replica facilitates industrial-scale processes utilizing the highly-ordered block copolymer films.

10 Claims, 4 Drawing Sheets

(56) References Cited

U.S. PATENT DOCUMENTS

| | | | |
|---|---|---|---|
| 6,858,521 | B2 | 2/2005 | Jin |
| 6,893,705 | B2 | 5/2005 | Thomas et al. |
| 6,926,953 | B2 | 8/2005 | Nealey et al. |
| 6,943,117 | B2 | 9/2005 | Jeong et al. |
| 7,030,167 | B2 | 4/2006 | Gunther |
| 7,081,269 | B2 | 7/2006 | Yang et al. |
| 7,109,249 | B2 | 9/2006 | Bruza et al. |
| 7,138,325 | B2 | 11/2006 | Maleville et al. |
| 7,189,435 | B2 | 3/2007 | Tuominen et al. |
| 7,190,049 | B2 | 3/2007 | Tuominen et al. |
| 7,517,466 | B2 | 4/2009 | Asakawa et al. |
| 7,544,578 | B2 | 6/2009 | Clevenger et al. |
| 7,632,544 | B2 | 12/2009 | Ho et al. |
| 8,211,737 | B2 | 7/2012 | Russell et al. |
| 2004/0124092 | A1 | 7/2004 | Black et al. |
| 2004/0175628 | A1 | 9/2004 | Nealey et al. |
| 2005/0235906 | A1 | 10/2005 | Legagneux et al. |
| 2006/0093954 | A1 | 5/2006 | Moudry et al. |
| 2006/0205875 | A1* | 9/2006 | Cha et al. ............ 525/88 |
| 2006/0257565 | A1 | 11/2006 | Jin et al. |
| 2006/0292870 | A1 | 12/2006 | Pribat |
| 2007/0092652 | A1 | 4/2007 | Timm et al. |
| 2007/0153222 | A1* | 7/2007 | Jo et al. ............ 349/187 |
| 2008/0014528 | A1 | 1/2008 | Bailey et al. |
| 2008/0230514 | A1 | 9/2008 | Park et al. |
| 2008/0311402 | A1 | 12/2008 | Jung et al. |
| 2008/0315270 | A1 | 12/2008 | Marsh et al. |
| 2009/0087664 | A1 | 4/2009 | Nealey et al. |
| 2010/0075116 | A1 | 3/2010 | Russell et al. |
| 2010/0086801 | A1 | 4/2010 | Russell et al. |
| 2011/0059299 | A1 | 3/2011 | Kim et al. |
| 2013/0302632 | A1 | 11/2013 | Russell et al. |

OTHER PUBLICATIONS

Jung et al., Orientation-Controlled Self-Assembled Nanolithography using a PS-PDMS Block Copolymers, 2007, vol. 7, No. 7, 2046-2050.*
Zhu et al., Nanotailored Crystalline Morphology in Hexagonally Perforated Layers of a Self-Assembled PS-b-PEO diblock copolymer, Macromolecules, 2002, 35, 3553-3562.*
Campo et al., Fabrication Approaches for Generating Complex Micro- and Nanopatterns on Polymeric Surfaces, Chem. Rev. 2008, 108,911-945.*
Lin et al. A Rapid Route to Arrays of Nanostructures in Thin Films, Advanced Materials, 2002, 14, No. 19, Oct. 2, 2002, 1373-1376.*
Gates et al. (New Approaches to Nanofabrication: Molding, Printing, and other Techniques, Chem. Rev. 2005,105,1171-1196).*
Final Office Action for U.S. Appl. No. 12/049,541, filed Mar. 17, 2008, Notification Date Jul. 6, 2011, 12 pages.
Non-Final Office Action for U.S. Appl. No. 12/049,541, filed Mar. 17, 2008, Notification Date Mar. 1, 2011, 52 pages.
U.S. Appl. No. 13/461,175, filed May 1, 2012.
U.S. Appl. No. 13/480,506, filed May 25, 2012.
Ansari et al., "Templating the paterning of gold nanoparticles using a stained triblock copolymer film surface", Journal of Mater. Chem. 13, 2003, pp. 2412-2413.
Asakawa et al., "Nano-Patterning for Patterned Media Using Block-Copolymer", Journal of Photopolymer Science and Technology, vol. 15, No. 2, 2002, pp. 465-470.
Bal et al., "Nanofabrication of integrated magnetoelectronic devices using patterned self-assembled copolymer templates", Applied Physics Letters, vol. 81, No. 18, 2002, pp. 3479-3481.
Black et al., "Spin-Dependent Tunneling in Self-Assembled Cobalt-Nanocrystal Superlattices", Science, vol. 290, 2000, pp. 1131-1134.
Black et al., "Integration of self-assembled diblock copolymers for semiconductor capacitor fabrication", Applied Physics Letters, vol. 79, No. 3, 2001, pp. 409-411.
Black, "Nanometer-Scale Pattern Registration and Alignment by Directed Diblock Copolymer Self-Assembly", IEEE Transactions of Nanotechnology, vol. 3, No. 3, Sep. 2004, pp. 412-415.
Bockstaller et al., "Block Copolymer Nanocomposites: Perspectives for Tailored Functional Materials", Advanced Materials, 17, 2005, pp. 1331-1349.
Bodycomb et al., "Single-Grain Lamellar Microdomain from a Diblock Copolymer", Macromolecules, 32, 1999, pp. 2075-2077.
Chan et al., "Ordered Bicontinuous Nanoporous and Nanorelief Ceramic Films from Self Assembling Polymer Precursers", Science, 286, 1999, pp. 1716-1719.
Cheng et al., "Formation of a Cobalt Magnetic Dot Array via Block Copolymer Lithography", Advanced Materials, 13, 2001, 5 pages.
Cheng et al., "Fabrication of nanostructures with long-range order using block copolymer lithograhy", Applied Physics Letters, vol. 81, No. 19, 2002, pp. 3657-3659.
Cheng et al., "A Highly Regular Two-Dimensional Array of Au Quantum Docts Deposited in a Periodically Nanoporous GaAs Epitaxial Layer", Advanced Materials, vol. 14, No. 21, 2002, pp. 1567-1570, Abstract, 2 pages.
Chiu et al., "Control of Nanoparticle Location in Block Copolymers", J. Am. Chem. Soc., 127, 2005, pp. 5036-5037.
Chou et al., "Sub-10 nm imprint lithography and applications", Journal of Vacuum Science and Technology B, vol. 15, No. 6, 1997, pp. 2897-2904.
De Rosa et al., "Microdomain patterns from directional eutectic solidification and epitaxy", Nature, 405, 2000, 5 pages.
Drockenmuller et al., "Covalent Stabilization of Nanostructures: Robust Block Copolymer Templates from Novel Thermoreactive Systems", Journal of Polymer Science, Part A: Polymer Science, vol. 43, 2005, pp. 1028-1037.
Du et al., "Additive-Driven Phase-Selective Chemistry in Block Copolymer Thin Films: The Convergence of Top-Down and Bottom-Up Approaches", Advanced Materials, vol. 16, No. 12, 2004, pp. 953-957.
Elhadji et al., "Orientation of self-assembled block copolymer cylinders perpendicular to electric field in mesoscale film", Applied Physics Letters, vol. 82, No. 6, 2003, pp. 871-873.
Fan et al., "Semiconductor Nanowires: From Self-Organization to Patterned Growth", Small, vol. 2, No. 6, 2006, pp. 700-717.
Fasolka et al., "Observed Substrate Topography-Mediated Lateral Patterning of Diblock Copolymer Films", Physical Review Letters, vol. 79, No. 16, 1997, pp. 3018-3021.
Fasolka et al., "Block Copolymer Thin Films: Physics and Applications", Ann. Rev. Mater. Res., 31, 2004, 18 pages.
Feldheim et al., "Electron Transfer in Self-Assembled Inorganic Polyelectrolyte/Metal Nanoparticle Heterostructures", J. Am. Chem. Soc., 118, 1996, pp. 7640-7641.
Fukunaga et al., "Large-Scale Alignment of ABC Block Copolymer Microdomains via Solvent Vapor Treatment", Macromolecules, 33, 2000, pp. 947-953.
Fukutani et al., "Ultrahigh Pore Density Nanoporous Films Produced by the Phase Separation of Eutectic Al—Si for Template-Assisted Growth of Nanowire Arrays", Advanced Materials, vol. 16, No. 16, 2004, p. 1456-1460.
Gaubert et al., "Highly parallel fabrication of nanopatterned surfaces with nanoscale orthogonal biofunctionalization imprint lithography", Nanotechnology, 18, 2007, pp. 1-7.
Gibson, "Reading and Writing with Electron Beams", Physics Today, 1997, pp. 56-61.
Glass et al., "Block copolymer micelle nanolithography on non-conductive substrates", New Journal of Physics, 6, 2004, pp. 1-17.
Golzhauser et al., "Chemical Nanolithography with Electron Beams", Adv. Mater., 13, No. 11, 2001, pp. 806-809.
Gorzolnik et al., "Nano-structured micropatterns by combination of block copolymer self-assembly and UV photolithography", Nanotechnology 17, 2006, pp. 5027-5032.
Guarini et al., "Nanoscale patterning using self-assembled polymers for semiconductor applications", J. Vac. Sci. Tech. B 19, 2001, 5 pages.
Guarini et al., "Process integration of self-assembled polymer templates into silicon nanofabrication", J. Vac. Sci. Technol. B, 20(6), 2002, pp. 2788-2792.
Hahm et al., "Cylinder Alignment in Annular Structures of Microphase-Separated Polystyrene-b-Poly(methyl methacrylate)", Langmuir, 16, 2000, pp. 4766-4769.

(56) References Cited

OTHER PUBLICATIONS

Hamley, "Nanotechnology with Soft Materials", Angew. Chem. Int. Ed., 42, 2003, pp. 1692-1712.

Harrison et al., "Lithography with a mask of block copolymer microstructures", J. Vac. Sci. Technol. B, 16(2), 1998, pp. 544-552.

Hartney et al., "Block copolymers as bilevel resists", J. Vac. Sci. Tech. B 3, 1985, pp. 1346-1351.

Haryono et al., "Controlled Arrangement of Nanoparticle Arrays in Block-Copolymer Domains", Small, vol. 2, No. 5, pp. 600-611, 2006, Abstract 2 pages.

Haupt et al., "Nanoporous Gold Films Created using Templates Formed from Self-Assembled Structures of Inorganic-Block Copolymer Micelles", Advanced Materials, 15, 2003, 3 pages.

Hawker et al., "Block Copolymer Lithograhy: Merging 'Bottom-Up' with 'Top-Down' Processes", MRS Bulletin, vol. 30, 2005, pp. 952-966.

Heier et al, "Thin Diblock Copolymer Films on Chemically Heterogeneous Surfaces", Macromolecules, 30, 1997, pp. 6610-6614.

Heier et al., "Transfer of a chemical substrate pattern into an island-forming diblock copolymer film", Journal of Chemical Physics, vol. 111, No. 24, 1999, pp. 11101-11110.

Ho et al., "Solvent-induced microdomain orientation in polystyrene-b-poly(L-lactide) diblock copolymer thin films for nanopatterning", Polymer, 46, 2005, pp. 9362-9377.

Honda et al., "Impedance Chracteristics of the Nanoporous Honeycomb Diamond Electrodes for Electrical Double-Layer Capacitor Applications", Journal of the Electrochemcial Society, 147(7), 2001, pp. A668-A679.

Huang et al., "Modeling copolymer Adsorption on Laterally Hetergeneous Surfaces", Physical Review Letters, vol. 66, No. 5, 1991, pp. 620-623.

Huang et al., "Nanodomain control in copolymer thin films", Nature, vol. 295, 1998, pp. 757-758.

Jaramilo et al., "Catalytic Activity of Supported Au Nanoparticles Deposited from Block Copolymer Micelles", J. Am. Chem. Soc., 125, 2003, pp. 7148-7149.

JP2001189466, EPO Abstract, Jul. 10, 2001, 2 pages.

Kim et al., "Morphological Development in Solvent-Cast Polystyrene-Polybutadiene-Polystyrene (SBS) Triblock Copolymer Thin Films,"Macromolecules, 31, 1998, pp. 2569-2577.

Kim et al., "Phase transition behavior in thin films of block copolymers by use of immiscible solvent vapors", Soft Matter, 7, 2001, pp. 443-447.

Kim et al., "Epitaxial self-assembly of block copolymers on lithographically defined nanopatterned substrates", Nature 424, 2003, pp. 411-414.

Kim et al., "Highly Oriented and Ordered Arrays from Block Copolymers via Solvent Evaporation", Advanced Materials, 16, No. 3, 2004, pp. 226-231.

Kim et al., "Nanoparticle-Induced Phase Transitions in Diblock-Copolymer Films", Advanced Materials, vol. 17, No. 21, pp. 2618-2622, 2005, Abstract 2 pages.

Kim et al., "Salt Complexation in Block Copolymer Thin Films", Macromolecules, 39, 2006, pp. 8473-8479.

Kimura et al., "Long-Range Ordering of Diblock Copolymers Induced by Droplet Pinning", Langmuir, 19, 2003, pp. 9910-9913.

Kubo et al., "Characterization of pattern transfer in the fabrication of magnetic nanostructure arrays by block copolymer lithography", Applied Physics Letters, 90, 2007, pp. 233113.1-233113.3.

Lammertink et al., "Nanostructured Thin Films of Organic-Organometallic Block Copolymers: One-Step Lithography with Poly(ferrocenylsilanes) by Reactive Ion Etching", Advanced Materials, 12, 2000, 6 pages.

Lammertink et al., "Poly(ferrocenyldimethylsilanes) for Reactive Ion Etch Barrier Applications", Chem. Mater., 13, 2001, pp. 429-434.

Li et al. "Dense arrays of ordered GaAs nanostructures by selective area growth on substrates patterned by block copolymer lithograpy", Appl. Phys. Lett., 76, 2000, p. 1689-1691.

Li et al., "Spatially Controlled Fabrication of Nanoporous Block Copolymers", Chem. Mater., 16(20), 2004, pp. 3800-3808, Abstract 1 page.

Li et al., "Ordered Block-Copolymer Assembly Using Nanoimprint Lithography", Nano Letters, 4(9), 2004, pp. 1633-1636.

Li et al., "Patternable Block Copolymers", Adv. Polym. Sci., 190, 2005, pp. 183-226.

Li et al., "Block copolymer patterns and templates", Materials Today, vol. 9, No. 9, 2006, pp. 30-39.

Lin et al., "A Rapid Route to Arrays of Nanostructures in Thin Films", Adv. Mater., 14, No. 19, 2002, pp. 1373-1376.

Lin et al., "Self-directed self-assembly of nanoparticlelcopolymer mixtures", Nature, vol. 434, 2005, pp. 55-59.

Lopes et al., "Hierarchical self-assembly of metal nanostructures on diblock copolymer scaffolds", Nature, vol. 414, 2001, pp. 735-738.

Ludwigs et al., "Self-assembly of functional nanostructures from ABC triblock copolymers", Nature Materials, vol. 2, 2003, pp. 744-747.

Maier et al., "Plasmonics—A Route to Nanoscale Optical Devices", Adv. Mater. 13, No. 19, 2001, pp. 1501-1505.

Mansky et al., "Controlling Polymer-Surface Interactions with Random Copolymer Brushes", Science, 275, 1997, pp. 1458-1460.

Mansky et al., "Large-Area Domain Alignment in Block Copolymer Thin Films Using Electric Fields", Macromolecules 31, 1998, pp. 4399-4401.

Mayes et al., "Tailored Polymer Surfaces", MRS Bulletin, 1997, pp. 43-47.

Meli et al., "Self-Assembled Masks for the Transfer of Nanometer-Scale Patterns into Surfaces: Characterization by AFM and LFM", Nano Letters, vol. 2, No. 2, 2002, pp. 131-135.

Morikawa et al., "Optical Alignment and Patterning of Nanoscale Microdomains in a Block Copolymer Thin Film", Adv. Mater., 18, 2006, pp. 883-886.

Morkved et al., "Local Control of Microdomain Orientations in Diblock Copolymer Thin Filmes with Electric Fields", Science, vol. 273, 1996, pp. 931-933.

Park et al. "Block Copolymer Lithography: Periodic Arrays of ~$10^{11}$ Holes in 1 Square Centimeter", J. Am. Chem. Soc., vol. 123, No. 7, 2001, pp. 1515-1520.

Park et al., "Large area orientation of block copolymer microdomains in thin films via directional crystallization of a solvent", Macromolecules, 34, 2001, pp. 2602-2606.

Park et al., "Double textured cylindrical block copolymer domains via directional solidification on a topographyically patterned substrate", Applied Physics Letters, vol. 79, No. 6, 2001, pp. 848-850.

Park et al., "Large area dense nanoscale patterning of arbitrary surfaces", Applied Physics Letters, vol. 79, No. 2, 2001, pp. 257-259.

Park et al., "Enabling nanotechnology with self assembled block copolymer patterns", Polymer, 44, 2003, pp. 6725-6760.

Park et al., "Solvent-Induced Transition from Micelles in Solution to Cylindrical Microdomains in Diblock Copolymer Thin Films", Macromolecules, 40, 2007, pp. 9059-9063.

Park et al., "Fabrication of Highly Ordered Silicon Oxide Dots and Stripes from Block Copolymer Thin Films", Advanced Materials, vol. 210, No. 4, 2008, pp. 681-685, Abstract 2 pages.

Park et al., "From Nanorings to Nanodots by Patterning with Block Copolymers", Nano Letters, vol. 8, No. 6, 2008, pp. 1667-1672.

Park et al., "A simple route to highly oriented and ordered nanoporous block copolymer templates", ACS Nano, vol. 2, No. 4, 2008, pp. 766-772.

Park et al., "Macroscopic 10-Terabit per Square-Inch Arrays from Block Copolymers with Lateral Order", Science 323, 2009, pp. 1030-1033.

International Search Report and Written Opinion for PCT/US2008/057187, International Application Filing Date Mar. 17, 2008, Date of Mailing Apr. 8, 2008, 16 pages.

Pelletier et al., "Aluminum nanowire polarizing grids: Fabrication and analysis", Applied Physics Letters 88, pp. 2006, 211114.1-211114.3.

Pereira et al., "Diblock Copolymer Thin Film Melts on Striped, Heterogeneous Surfaces: Parallel, Perpendicular and Mixed Lamellar Morphologies", Macromolecules, 32, 1999, pp. 758-764.

(56) References Cited

OTHER PUBLICATIONS

Rockford et al., "Polymers on Nanoperiodic, Heterogeneous Surfaces", Physical Reivew Letters, vol. 82, No. 12, 1999, pp. 2602-2605.
Rockford et al., "Propagation of Nanopatterned Substrate Templated Ordering of Block Copolymers in Thick Films", Macromolecules, 34, 2001, pp. 1487-1492.
Ross, "Patterned Magnetic Recording Media", Annu. Rev. Mater. Res., 31, 2001, pp. 203-235.
Russell et al., "Small Angle Neutron Scattering Studies on Ultrathin Films", Macromolecules, 28, 1995, pp. 787-789.
Russell et al., "Block Copolymers As Nanoscopic Templates", Macromol. Symp. 159, 2000, pp. 77-88.
Segalman et al., "Graphoepitaxy of Spherical Domain Block Copolymer Films", Adv. Mater., 13, No. 15, 2001, pp. 1152-1155.
Segalman, "Patterning with block copolymer thin films", Materials Science and Engineering R 48, 2005, pp. 191-226.
Sohn et al., "Sluggish Development of Parallel Lamellae at the Strongly Interacting Interface in Thin Films of Symmetric Diblock Copolymers", Langmuir, 18, 2002, pp. 10505-10508.
Sohn et al., "Directed Self-Assembly of Two Kinds of Nanoparticles Utilizing Monolayer Films of Diblock Copolymer Micelles", J. Am. Chem. Soc. 125, 2003, pp. 6368-6369.
Song et al., "Faceting Kinetics of Stepped Si(113) Surfaces: A Time-Resolved X-Ray Scattering Study", Physical Review Letters, vol. 74, No. 26, 1995, pp. 5240-5243.
Song et al., "Attractive step-step interactions, tricriticality, and faceting in the orientational phase diagram of silicon surfaces between [113] and [114]", Physical Review B, vol. 51, No. 15, 1995, pp. 10068-10085.
Spatz et al., "Ultrathin Diblock Copolymer/Titanium Laminates—A Tool for Nanolithography", Advanced Materials, 10, 1998, pp. 849-852.
Spatz et al., "Micellar Inorganic—Polymer Hybrid Systems—A Tool for Nanolithography", Advanced Materials, 11, No. 2, 1999, pp. 149-153.
Spatz et al. "A Combined Top-Down/Bottom-Up Approach to the Microscopic Localization of Metallic Nanodots", Advanced Materials, vol. 14, No. 24, 2002, pp. 1827-1832.
Stoykovich et al., "Directed Assembly of Block Copolymer Blends into Nonregular Device-Oriented Structures", Science, 308, 2005, pp. 1442-1446.
Stoykovich et al., "Block copolymers and conventional lithography", Materials Today, vol. 9, No. 9, 2006, pp. 20-29.
Tang et al., "Long-Range Ordered Thin Films of Block Copolymers Prepared by Zone-Casting and Their Thermal Conversion into Ordered Nanostructured Carbon", J. Am. Chem. Soc., 127, 2005, pp. 6918-6919.
Temple et al., "Spontaneous Vertical Ordering and Pyrolytic Formation of Nanoscopic Cermaic Patterns from Poly (styrene-b-ferrocenysilane)", Advanced Materials, 15, 2003, 13 pages.
Thompson et al., "Predicting the Mesophases of Copolymer-Nanoparticle Composites", Science, 292, 2001, pp. 2469-2472.
Thurn-Albrecht et al., "Overcoming Interfacial Interactions with Electric Fields", Macromolecules, 33, 2000, pp. 3250-3253.
Thurn-Albrecht et al., "Ultrahigh-Density Nanowire Arrays Grown in Self- Assembled Diblock Copolymer Templates", Science, 290, 2000, pp. 2126-2129.
Thurn-Albrecht et al., "Nanoscopic Templates from Oriented Block Copolymer Films", Advanced Materials, 12, 2000, 4 pages.
Villar et al., "Study of oriented block copolymers films obtained by roll-casting", Polymer, 44, 2002, pp. 5139-5145.
Wang et al., "Simulations of the Morphology of Cylinder-Forming Asymmetric Diblock Copolymer Thin Films on Nanopatterned Substrates", Macromolecules, 36, 2000, pp. 1731-1740.
Wang et al., "One step fabrication and characterization of platinum nanopore electrode ensembles formed via amphiphilic block copolymer self-assembly", Science Direct, 52, 2006, pp. 704-709.
Williams et al., "Etch Rates for Micromachining Processing—Part II", J. Micro. Sys., vol. 12, No. 6, 2003, pp. 761-778.
Wyrwa et al., "One-Dimensional Arrangements of Metal Nanoclusters", Nano Letters, vol. 2, No. 4, 2002, pp. 419-421.
Xu et al., "The influence of molecular weight on nanoporous polymer films", Polymer, 42, 2001, pp. 9091-9095.
Xu et al., "Block Copolymer Surface Reconstruction: A Reversible Route to Nanoporous Films", Advanced Functional Materials, 13, No. 9, 2003, pp. 698-702.
Xu et al., "Interfacial Energy Effects on the Electric Field Alignment of Symmetric Diblock Copolymers", Macromolecules, 36, 2003, pp. 6178-6182.
Yang et al., "Guided Self-Assembly of Symmetric Diblock Copolymer Films on Chemically Nanopatterned Substrates", Macromolecules, 33, 2000, pp. 9575-9582.
Zalusky et al., "Mesoporous Polystyrene Monoliths", J. Am. Chem. Soc., 123, 2001, pp. 1519-1520.
Segalman et al., "Ordering and Melting of Block Copolymer Spherical Domains in 2 and 3 Dimensions", Macromolecules, 2003, 36(9), 3272-3288.
Final Office Action for U.S. Appl. No. 13/944,329; filed Jul. 17, 2013; Notification Date Jun. 25, 2015; 11 pages.
Non Final Office Action for U.S. Appl. No. 13/944,329, filed Jul. 17, 2013; Notification Date Mar. 10, 2015; 36 pages.
Final Office Action dated Dec. 31, 2014; U.S. Appl. No. 14/048,073; filed Oct. 8, 2013; (6 pages).
Non-Final Office Action dated Oct. 31, 2014; U.S. Appl. No. 14/048,073, filed Oct. 8, 2013; (29 pages).
Non-Final Office Action dated May 13, 2015; U.S. Appl. No. 13/480,506, filed May 25, 2012 (50 pages).
US Non-Final Office Action for U.S. Appl. No. 13/944,329, filed Jul. 17, 2013; Notification date Oct. 5, 2015; 15 pages.

\* cited by examiner

SELF-ASSEMBLY OF BLOCK COPOLYMERS ON TOPOGRAPHICALLY PATTERNED POLYMERIC SUBSTRATES

CROSS REFERENCE TO RELATED APPLICATION

This application is a division of U.S. Nonprovisional application Ser. No. 12/553,484 now U.S. Pat. No. 8,247,033, which claims the benefit of U.S. Provisional Patent Application Ser. Nos. 61/170,707 filed Apr. 20, 2009 and 61/098,253 filed Sep. 19, 2008. Each of the priority applications is fully incorporated herein by reference.

STATEMENT REGARDING FEDERALLY SPONSORED RESEARCH & DEVELOPMENT

This invention was made with government support under Office of Basic Energy Sciences Grant No. DE-FG02-96ER45612 awarded by the Department of Energy; Office of Basic Energy Sciences Grant No. DE-AC02-05CH11231 awarded by the Department of Energy; and MRSEC Polymers Grant No. DMR-0213695 awarded by the National Science Foundation. The government has certain rights in the invention.

BACKGROUND OF THE INVENTION

For nanotechnological applications, the use of thin films of materials is highly preferred. See, e.g., Segalman, R. A. *Mater. Sci. Eng.* 2005, R48, 191; Li, M.; Ober, C. K. *Materials Today* 2006, 9, 30; Hawker, C. J.; Russell, T. P. *MRS Bulletin* 2005, 30, 952; and Li, M.; Coenjarts, C. A.; Ober, C. K. *Adv. Polym. Sci.* 2005, 190, 183. It is desirable, in the case of block copolymers (BCPs), to have the nanoscopic domains, sometimes referred to as microdomains, oriented in a specific direction with a long-range lateral order for applications such as polarizers (Pelletier, V.; Asakawa, K.; Wu, M.; Adamson, D. H.; Register, R. A.; Chaikin, P. M. *Appl. Phys. Lett.* 2006, 88, 211114), templates for pattern transfer to generate microelectronic integrated circuits (Black, C. T. *IEEE Trans. Nanotechnol.* 2004, 3, 412), magnetic media (Ross, C. A. *Annu. Rev. Mater. Res.* 2001, 31, 203), and optical waveguides (Maier, S. A.; Brongersma, M. L.; Kik, P. G.; Meltzer, S.; Requicha, A. A. G.; Atwater, H. A. *Adv. Mater.* 2001, 13, 1501; Kim, D. H.; Lau, K. H. A.; Robertson, J. W. F.; Lee, O.-J.; Jeong, U.; Lee, J. I.; Hawker, C. J.; Russell, T. P.; Kim, J. K.; Knoll, W. *Adv. Mater.* 2005, 17, 2442).

In recent years, a number of approaches have been developed to control the orientation and enhance the lateral order of the microdomains by applying external fields, such as electric fields (Thorn-Albrecht, T.; DeRouchey, J.; Russell, T. P. *Macromolecules* 2000, 33, 3250), shear (Villar, M. A.; Rueda, D. R.; Ania, F.; Thomas, E. L. *Polymer* 2002, 43, 5139), temperature gradients (Bodycomb, J.; Funaki, Y.; Kimishima, K.; Hashimoto, T. *Macromolecules* 1999, 32, 2075), graphoepitaxy (Segalman, R. A.; Yokoyama, H.; Kramer, E. J. *Adv. Mater.* 2001, 13, 1152), chemically patterned substrates (Stoykovich, M. P.; Muller, M.; Kim, S. O.; Solak, H. H.; Edwards, E. W.; de Pablo, J. J.; Nealey, P. F. *Science* 2005, 308, 1442), controlled interfacial interactions (Mansky, P.; Liu, Y.; Huang, E.; Russell, T. P.; Hawker, C. J. *Science* 1997, 275, 1458; Drockenmuller, E.; Li, L. Y. T.; Ryu, D. Y.; Harth, E.; Russell, T. P.; Kim, H. C.; Hawker, C. J. *J. Polym. Sci., Part A: Polym. Chem.* 2005, 43, 1028), zone casting (Tang, C.; Tracz, A.; Kruk, M.; Zhang, R.; Smilgies, D.-M.; Matyjaszewski, K.; Kowalewski, T. *J. Am. Chem. Soc.* 2005, 127, 6918), optical alignment (Morikawa, Y.; Nagano, S.; Watanabe, K.; Kamata, K.; Iyoda, T.; Seki, T. *Adv. Mater.* 2006, 18, 883), solvent fields (Kim, G.; Libera, M. *Macromolecules* 1998, 31, 2569; Kimura, M.; Misner, M. J.; Xu, T.; Kim, S. H.; Russell, T. P. *Langmuir* 2003, 19, 9910; Ludwigs, S.; Böker, A.; Voronov, A.; Rehse, N.; Magerle, R.; Krausch, G. *Nature Mater.* 2003, 2, 744; Kim, S. H.; Misner, M. J.; Xu, T.; Kimura, M.; Russell, T. P. *Adv. Mater.* 2004, 16, 226; Ho, R.-M.; Tseng, W.-H.; Fan, H.-W.; Chiang, Y.-W.; Lin, C.-C.; Ko, B.-T.; Huang, B.-H. *Polymer* 2005, 46, 9362; Lin, Z.; Kim, D. H.; Wu, X.; Boosanda, L.; Stone, D.; LaRose, L.; Russell, T. P. *Adv. Mater.* 2002, 14, 1373; Hahm, J.; Sibener, S. J. *Langmuir* 2000, 16, 4766; and Park, S.; Kim, B.; Wang, J.-Y.; Russell, T. P. *Adv. Mater.* 2008, 20, 681), and so on.

Solvent evaporation is a strong and highly directional field. Making BCP thin films under various solvent evaporation conditions has been found to be a good way to manipulate the orientation and lateral ordering of BCP microdomains in thin films Kim et al. first reported that solvent evaporation could be used to induce the ordering and orientation of BCP microdomains. Kim, G.; Libera, M. *Macromolecules* 1998, 31, 2569. Vertically aligned cylindrical PS microdomains could be obtained in polystyrene-b-polybutadiene-b-polystyrene triblock copolymer thin films with a thickness of ~100 nm. The same effect was also observed with polystyrene-b-poly (ethylene oxide) (PS-b-PEO) and polystyrene-b-poly(L-lactide) BCP thin films and was attributed to a copolymer/solvent concentration gradient along the direction normal to the film surface giving rise to an ordering front that propagated into the film during solvent evaporation. Ho, R.-M.; Tseng, W.-H.; Fan, H.-W.; Chiang, Y.-W.; Lin, C.-C.; Ko, B.-T.; Huang, B.-H. *Polymer* 2005, 46, 9362; Lin, Z.; Kim, D. H.; Wu, X.; Boosanda, L.; Stone, D.; LaRose, L.; Russell, T. P. *Adv. Mater.* 2002, 14, 1373. This orientation was independent of the substrate. However, the lateral ordering of the cylindrical microdomains was poor. Hahm et al. (Hahm, J.; Sibener, S. J. *Langmuir* 2000, 16, 4766) and later Kimura et al. (Kimura, M.; Misner, M. J.; Xu, T.; Kim, S. H.; Russell, T. P. *Langmuir* 2003, 19, 9910) showed that evaporation-induced flow, in solvent-cast BCP films, produced arrays of nanoscopic cylinders oriented normal to the surface with a high degree of ordering. Recently, Ludwigs et al. demonstrated that solvent annealing could markedly enhance the ordering of BCP microdomains in thin films Ludwigs, S.; Baer, A.; Voronov, A.; Rehse, N.; Magerle, R.; Krausch, G. *Nature Mater.* 2003, 2, 744. By controlling the rate of solvent evaporation and solvent annealing in thin films of PS-b-PEO, Kim et al. achieved nearly-defect-free arrays of cylindrical microdomains oriented normal to the film surface that spanned the entire film. Kim, S. H.; Misner, M. J.; Xu, T.; Kimura, M.; Russell, T. P. *Adv. Mater.* 2004, 16, 226. Moreover, the use of a co-solvent enabled further control over the length scale of lateral ordering. The most recent results showed that perpendicular cylindrical microdomains oriented normal to the film surface could be obtained directly by spin-coating polystyrene-b-poly(4-vinylpyridine) (PS-b-P4VP) BCPs from mixed solvents of toluene and tetrahydrofuran (THF) and arrays of highly ordered cylindrical microdomains formed over large areas after exposing the films to the vapor of a toluene/THF mixture. Park, S.; Wang, J.-Y.; Kim, B.; Chen, W.; Russell, T. P. *Macromolecules* 2007, 40, 9059. This process was independent of substrate, but it strongly depends on the quality of the solvents for each block and the solvent evaporation rate. Furthermore, the ultimate achievable data storage density achievable with these BCPs will not exceed 1 terabit/inch$^2$ (0.155 terabit/centimeter$^2$). Processes to use alternate BCPs, like PS-b-P4VP or PS-b-PEO containing salt, have been developed that are simpler to employ and, more importantly, the interactions between the segments of the copolymer are very non-favorable, making defects energetically costly and, also, opening an avenue to smaller domain sizes and separation distances.

Several methods have been developed to prepare nearly perfect patterns onto substrates. Conventional photolithography, electron beam (e-beam) lithography, and scanning force probe lithography are accessible techniques for fabrication of nanometer-size patterns. For example, Schmidt and co-workers showed the successful electrochemical modification of self-assembled monolayers at positions where a conductive scanning probe was in contact with a self-assembled monolayer. Wyrwa, D.; Beyer, N.; Schmid, G. *Nano Lett.* 2002, 2, 419. The induced chemical contrast was used to guide the covalent binding of Au crystals from solution. E-beam lithography is a common method for fabrication of sub-micrometer structures. Although a beam of electrons may be focused to less than one nanometer in diameter, the resolution is limited by the interaction of the beam with the resist material and by the radius of gyration of the macromolecules, which is usually a few nanometers. Gibson, J. M. *Phys. Today* 1997, 50, 56. New developments in using self-assembled monolayers overcome these restrictions inherent with standard resist materials as their thickness is usually a few angstroms. Structures as small as a few nanometers have been fabricated by using this concept. See, e.g., Gölzhäuser, A.; Eck, W.; Geyer, W.; Stadler, V.; Weimann, T.; Hinze, P.; Grunze, M. *Adv. Mater.* 2001, 13, 806; Glass, R.; Arnold, M.; Cavalcanti-Adam, E. A.; Blümmer, J.; Haferkemper, C.; Dodd, C.; Spatz, J. P. *New J. Phys.* 2004, 6, 101; Yang, S.-M.; Jang, S. G.; and Choi, D.-G. U.S. Pat. No. 7,081,269 (2006). However, these approaches require expensive equipment and high-energy doses and are not suitable for non-conductive substrates, unless additional treatment is carried out. Moreover, e-beam patterning is a time-consuming serial process not suitable for large areas.

It is highly desirable to develop parallel processes where the sequential generation of nanoscopic features is avoided and the patterning is achieved in one-step. Nanoimprint lithography (NIL) is one such process to control the positional order of the microphase separated morphology. NIL can be used for locally controlling the self-assembly process of block copolymers and determining the precise positioning of the phase-separated domains via the topography of mold, rather than the substrate. Li, H.-W.; Huck, W. T. S. *Nano Letters* 2004, 4, 1633. NIL creates features by a mechanical deformation of a polymer film by pressing a hard mold into the film at temperatures higher than the glass transition temperature of the polymer. This high-throughput, low cost process is not diffraction limited, and sub-10 nanometer resolution has been reported. See, e.g., Chou, S. Y.; Krauss, P. R.; Zhang, W.; Guo, L.; Zhuang, L. *J. Vac. Sci. Technol. B* 1997, 15, 2897; Li, H.-W.; Huck, W. T. S. *Nano Lett.* 2004, 4, 1633; Chou, S. Y. U.S. Pat. No. 5,772,905 (1998); and Jeong, J.-H.; Sohn, H.; Sim, Y.-S.; Shin, Y.-J.; Lee, E.-S.; and Whang, K.-H. U.S. Pat. No. 6,943,117 (2005). Yet, NIL has the limitation that it requires a master that is used for the printing and, as of yet, it has not been possible to generate a perfect master with uniform, nanoscopic features sizes less than 20 nanometers over large lateral distances while maintaining the features in register. There remains a need for a parallel process for generating large area, high-density, highly-ordered arrays with feature sizes less than 20 nanometers.

BRIEF DESCRIPTION OF THE INVENTION

The above-described and other drawbacks are alleviated by a method of forming a nanopatterned surface, comprising: forming a polymeric replica of a topographically patterned crystalline surface, wherein the polymeric replica comprises a topographically patterned surface opposing the topographically patterned crystalline surface; forming a block copolymer film on the topographically patterned surface of the polymeric replica; and annealing the block copolymer film to form an annealed block copolymer film comprising a nanopatterned surface.

Another embodiment is a method of forming a nanopatterned surface, comprising: forming a block copolymer film on a topographically patterned surface of a polymer layer; wherein the topographically patterned surface of the polymer layer is formed in contact with a topographically patterned crystalline surface; and annealing the block copolymer film to form an annealed block copolymer film comprising a nanopatterned surface.

Another embodiment is a polymer layer comprising a topographically patterned surface formed in contact with a topographically patterned surface of a single crystal substrate; wherein the topographically patterned surface of the single crystal substrate is a substantially planar surface at least one degree removed from any crystallographic plane of the single crystal substrate.

Another embodiment is a layered article, comprising: a single crystal substrate comprising a topographically patterned surface; wherein the topographically patterned surface is a planar surface at least one degree removed from any crystallographic plane of the single crystal substrate; and a polymer layer comprising a topographically patterned surface in contact with the topographically patterned surface of the single crystal substrate.

Another embodiment is a layered article, comprising: a polymer layer comprising a topographically patterned surface formed in contact with a topographically patterned surface of a single crystal substrate; wherein the topographically patterned surface of the single crystal substrate is a substantially planar surface at least one degree removed from any crystallographic plane of the single crystal substrate; and a block copolymer film comprising a surface in contact with the patterned surface of the polymer layer.

These and other embodiments are described in detail below.

DETAILED DESCRIPTION OF THE INVENTION

Figure 1:
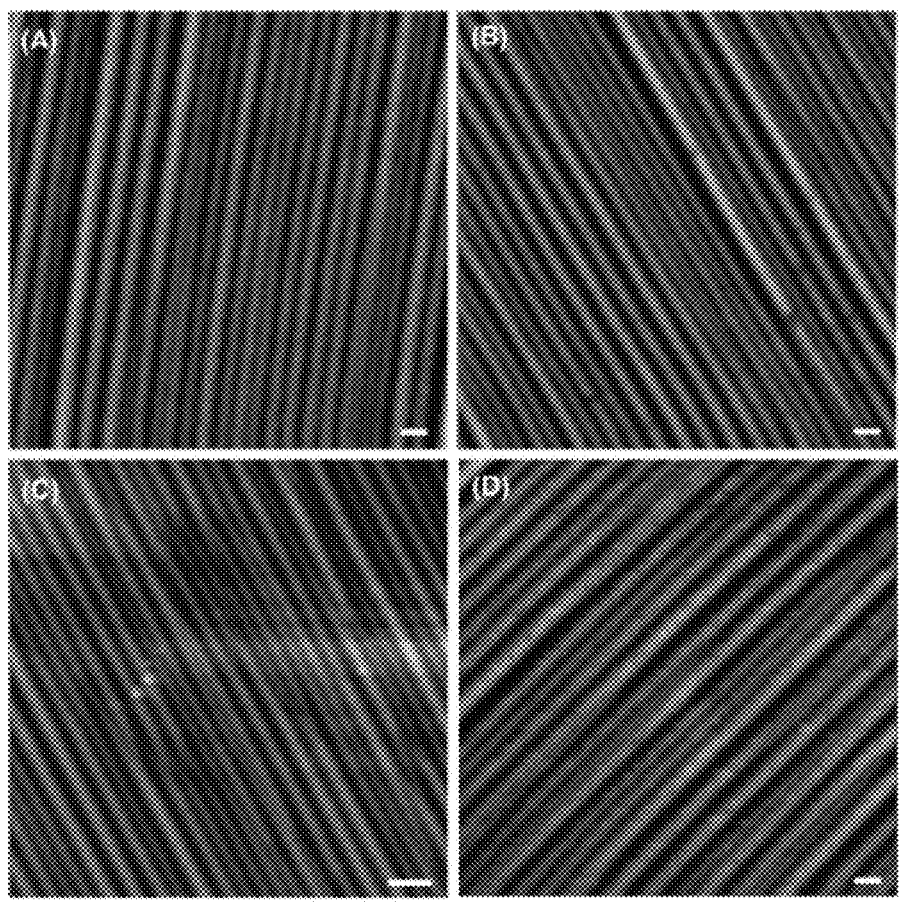
FIG. 1 consists of atomic force microscopic (AFM) images of the patterned surfaces of four polymeric replicas formed in contact with a saw-tooth patterned crystalline sapphire surface; the polymeric materials are (A) polydimethylsiloxane; (B) fluorinated ethylene-propylene copolymer; (C) polyimide (derived from pyromellitic dianhydride and 4,4'-oxydianiline); and (D) poly(butylene terephthalate) (PBT); the scale bars are 200 nanometers.

The present invention utilizes the crystal ordering of a substrate, like single crystal silicon or sapphire, to produce a topographic patterning of the substrate that is replicated in a polymer layer that in turn guides the placement of the nanoscopic features of a BCP film. For example, miscut silicon single crystals can be used to produce large areas of well-ordered, sawtooth-like surface morphologies. Song, S.; Mochrie, S. G. J.; Stephenson, G. B. *Phys. Rev. Lett.* 1995, 74, 5240. A characteristic lateral spacing of <100 nanometers can easily be achieved over surface areas of centimeter$^2$ dimensions that can be used to guide the self-assembly of BCPs. In copending U.S. patent application Ser. No. 61/098,253 filed Sep. 19, 2008 (as well as S. Park et al., *Science* 2009, 323, 1030), a block copolymer film is formed directly on a topographically and/or chemically patterned surface of a crystalline substrate. In the present application, a polymeric replica is formed from a topographically patterned crystalline surface, and a block copolymer film is formed on the resulting topographically patterned polymeric replica. The use of a polymeric replica offers significant processing advantages in that the polymeric replica—unlike the topographically patterned crystalline substrate from which it is formed—can be flexible and even elastomeric, thus permitting the use of roll-to-roll processing methods for the formation of high-density arrays and also permitting the fabrication of curved (non-planar) high-density arrays. The combination of forming a BCP film on a regularly patterned surface and solvent annealing of the BCP film can be used to fabricate nanoporous templates or scaffolds having a feature size at least as small as 5 nanometers over a substrate of at least centimeter$^2$ dimensions. The process is compatible with existing fabrication technologies and is, therefore, nondisruptive.

One embodiment is a method of forming a nanopatterned surface, comprising: forming a polymeric replica of a topographically patterned crystalline surface, wherein the polymeric replica comprises a topographically patterned surface opposing the topographically patterned crystalline surface; forming a block copolymer film on the topographically patterned surface of the polymeric replica; and annealing the block copolymer film to form an annealed block copolymer film comprising a nanopatterned surface.

As used herein the term "nanopatterned surface" refers to a surface comprising repeating chemical and/or topographical homogeneities that have dimensions on the nanometer scale. In some embodiments, the nanopatterned surface is the top surface of the annealed block copolymer film (where "top" is interpreted in terms of a structure in which the block copolymer film is on top of the topographically patterned surface of the polymeric replica). In these embodiments, the annealed block copolymer film can comprise chemical inhomogeneities in the form of cylinders or stripes (lamellae) perpendicular to the plane of the film, or spheres, cylinders, or stripes parallel to the plane of the film. In other embodiments, the nanopatterned surface is the top surface of a structure produced after further processing of the annealed block copolymer film. For example, the nanopatterned surface can be the top surface of a block copolymer film produced by solvent reconstruction of the annealed block copolymer film. As another example, the nanopatterned surface can be the top surface of a structure produced by coating a resist from a glancing angle onto the solvent-reconstructed, annealed block copolymer film. As yet another example, the nanopatterned surface can be the product of depositing a magnetic material directly (perpendicularly) onto the top surface and into the pores of a structure that is the product of solvent-reconstructing the block copolymer film, resist-coating the solvent-reconstructed block copolymer film, and etching the resist-coated block copolymer film to create voids in the underlying polymeric substrate corresponding to the voids of the solvent-reconstructed block copolymer film. In each of these examples, the nanopattern has dimensions corresponding to the dimensions of the cylinders, stripes, spheres, or lamellae of the annealed block copolymer film. These and other post-annealing processing steps conducted on annealed block copolymer films are described in copending U.S. Patent Application Ser. No. 61/098,253 filed Sep. 19, 2008.

The block copolymer film comprises microdomains that generate the nanopatterned surface. The term "microdomain" is known in the block copolymer arts and refers to a spatially separated, chemically distinct domain having dimensions on the order of nanometers or microns. Examples of microdomains include the cylindrical microdomains of poly(ethylene oxide) present in the polystyrene-b-poly(ethylene oxide) films described in the working examples below. Cylindrical microdomains can be separated by a nearest-neighbor distance of about 10 to about 100 nanometers. Microdomains further include stripes, spheres, and lamellae formed by the minor phase of a block copolymer film. In some embodiments, the annealed block copolymer film comprises a hexagonal array of cylindrical microdomains.

When the topographically patterned crystalline surface is a surface of a single crystal substrate, the method can be used to generate nanopatterned surfaces exhibiting long range order. For example, the annealed block copolymer film can comprise a hexagonal array of cylindrical microdomains exhibiting an orientation order of at least 0.9 over an area of at least 1 centimeter$^2$. Orientation order can be determined by image analysis of scanning force microscopy images of the block copolymer films using, for example, MATLAB software from The Mathworks. The cylindrical microdomains can be separated by a nearest-neighbor distance of about 10 to about 100 nanometers.

One very surprising aspect of the present invention is that the long range order of the cylindrical microdomains is more perfect than the long range orders of the single crystal master and the polymeric replica formed from it. While not wishing to be bound by any particular hypothesis, the present inventors believe that the topographical features of the polymeric replica guide—but do not completely control—the formation of ordered block copolymer patterns. As a result, crystal defects in the single crystal array are not translated into defects in the block copolymer pattern, and the block copolymer pattern is therefore more perfect than the crystalline master that created it. For example, when the annealed block copolymer film comprises a hexagonal array of cylindrical micro domains, that hexagonal array typically exhibits an orientation order greater than that of the polymeric replica.

The method begins with a crystalline substrate comprising a topographically patterned crystalline surface. Topographically patterned crystalline surfaces include annealed surfaces of crystalline substrates. This means that the crystalline substrate has been heated to a temperature at which a regularly repeating surface topology is formed, then cooled to preserve that topology so that it is present under the conditions with which the polymeric replica is formed. For example, miscut silicon can be annealed by heating to a temperature of approximately 1262° C. for one minute, then rapidly cooling to 1027° C., followed by slow cooling to room temperature. As another example, miscut C-plane sapphire can be annealed by heating in air at 1100° C. for 10 hours, followed by cooling to room temperature. As used herein, the term "miscut" means that the crystalline surface is at least 1 degree removed from any crystallographic plane of the crystalline substrate. In some embodiments, the crystalline surface is removed from any crystallographic plane by 1 to 10 degrees, specifically 2 to 8 degrees, more specifically 3 to 6 degrees. It will be understood that the term "miscut" includes some crystalline surfaces, such as miscut sapphire, that are conventionally defined with reference to a surface normal (rather than the surface plane).

In some embodiments, the topographically patterned crystalline surface is an annealed surface of a single crystal substrate. It will be understood that the term "single crystal substrate" includes substrates with small numbers of crystal defects. Suitable single crystal substrates include those formed from crystalline silicon, doped crystalline silicon, and crystalline aluminum oxide. Compared to the use of a polycrystalline substrate, use of a single crystal substrate permits the formation of annealed block copolymer films with long range order extending over areas on the order of square centimeters and larger. The working examples below demonstrate the use of an annealed surface of a single crystal aluminum oxide (sapphire) substrate as the topographically patterned crystalline surface.

When the crystalline substrate is a single crystal, the topographically patterned crystalline surface can be a so-called "miscut" surface, which is a substantially planar surface at least one degree removed from any crystallographic plane of the single crystal substrate. In this context, the term "substantially planar surface" means that the surface is planar except for the variations in surface height associated with the repeating topographic pattern. For example, annealed, sawtooth-patterned sapphire surfaces prepared according to the procedures in the working examples below are substantially planar surfaces.

Methods of forming crystalline substrates with miscut, annealed surfaces are described in, for example, Song, S.; Mochrie, S. G. J.; Stephenson, G. B. *Physical Review Letters* 1995, 74, 5240; and Song, S.; Mochrie, S. G. J. *Physical Review B* 1995, 51, 10068. Specific procedures for forming annealed surfaces on sapphire are provided in the working examples below.

There is no particular limit on the topology of the topographically patterned crystalline surface. In some embodiments, the annealed, topographically patterned crystalline surface exhibits a sawtooth pattern. The sawtooth pattern can be characterized by a peak-to-peak separation of about 24 to about 200 nanometers and a peak-to-valley separation of about 3 to about 20 nanometers. Within the range of 24 to 200 nanometers, the peak-to-peak separation can be 30 to 150 nanometers, specifically 40 to 120 nanometers, more specifically 50 to 100 nanometers. Within the range of 3 to 20 nanometers, the peak-to-valley separation can be 5 to 18 nanometers, specifically 8 to 15 nanometers.

In some embodiments, the topographically patterned crystalline surface exhibits a grooved pattern. The grooved pattern can be characterized by a groove depth of about 3 to about 20 nanometers and a groove-to-groove separation of about 24 to about 200 nanometers. Within the range of about 3 to about 20 nanometers, the groove depth can be 5 to 18 nanometers, specifically 8 to 15 nanometers. Within the range of 24 to 200 nanometers, the groove-to-groove separation can be about 30 to about 150 nanometers, specifically 40 to 120 nanometers, more specifically 50 to 100 nanometers.

The topographically patterned crystalline surface can be chemically homogeneous. Alternatively, the topographically patterned crystalline surface can be chemically patterned. One example of a chemically patterned surface is a surface comprising stripes of oxide and metal. As background, see L. Rockford, Y. Liu, T. P. Russell, M. Yoon, and S. C. J. Mochrie, *Physical Review Letters* 1999, 82, 2602.

A variety of techniques can be used to form the polymeric replica in contact with the topographically patterned crystalline surface. In one replica-forming technique, an existing polymer film is contacted with the topographically patterned crystalline surface at a temperature greater than the glass transition temperature, $T_g$, of the polymer film material. The polymer film material can be amorphous, semicrystalline, or crystalline. If the polymeric film material is a semicrystalline or crystalline material having a melting temperature, $T_m$, contacting the polymer film with the topographically patterned crystalline surface is preferably conducted at a temperature less than $T_m$. When the polymer film is contacted with the topographically patterned crystalline surface, a pressure up to about 100 megapascals, specifically about 100 to about 300 kilopascals, can be applied to improve contact between the two layers. Alternatively, no pressure can be applied, and capillary force can be sufficient to draw the polymer into the valleys of the topographically patterned crystalline surface.

Another replica-forming technique comprises polymerizing a monomer composition in contact with the topographically patterned crystalline surface. Any monomer composition that can be polymerized in the condensed state (i.e., in the absence of solvent) can be used. Suitable monomers can be deduced from the names of suitable polymers, listed below. The polymerization can occur by heating or exposure to radiation such as ultraviolet radiation, x-rays, or electron beams. Polymerization can be conducted with or without a catalyst. Examples of polymerizing a monomer composition include the polymerization of cyclic siloxanes to form polysiloxanes, the polymerization of acrylates to form polyacrylates, the polymerization of styrene (optionally in the presence of a crosslinker such as divinyl benzene) to form polystyrene, and the copolymerization of diols and diisocyanates to form polyurethanes.

Another replica-forming technique comprises reacting a first polymer in contact with the topographically patterned crystalline surface to form a second polymer in contact with the topographically patterned crystalline surface. Examples include reaction of polybutadiene or polyisoprene with chemical crosslinking agents to form crosslinked polybutadiene or crosslinked polyisoprene, reaction of unsaturated polyesters to form crosslinked polyesters, conversions of poly(amic acid)s to polyimides, and photochemical crosslinking of polyacetylenes.

In a specific embodiment, the patterned surface of the polymeric replica comprises a sawtooth pattern characterized by a peak-to-peak separation, $L_R$, the block copolymer film comprises a hexagonal array of cylindrical micro domains characterized by a nearest-neighbor microdomain separation, $L_{BCP}$, and $L_R/L_{BCP}$ has a value of about 1 to about 10, specifically about 1.2 to about 5, more specifically about 1.5 to about 3.

Independent of the replica-forming technique, a wide variety of polymers can be used to form the polymeric replica, including thermoplastics, thermoplastic elastomers, elastomers, and thermosets. Thermoplastics include polycarbonates, polyesters (such as poly(ethylene terephthalate) and poly(butylene terephthalate)), polyamides, polyimides, polyetherimides, polyurethanes, polystyrenes, poly(phenylene ether)s, poly(phenylene sulfide)s, polyarylsulfones, polyethersulfones, poly(ether ketone)s, polyacrylates (including poly(methyl methacrylate) and poly(butyl acrylate)), poly(vinyl butyral), polyethylenes, polypropylenes, poly(vinyl acetate), polyacrylonitriles, poly(vinyl chloride), poly(vinyl fluoride), poly(vinylidene fluoride), polytetrafluoroethylenes, copolymers of vinylidene chloride and vinyl chloride, copolymers of vinyl acetate and vinylidene chloride, copolymers of styrene and acrylonitrile, and the like, and combinations thereof. Examples of thermoplastic elastomers include styrenic block copolymers, polyolefin blends, elastomeric alloys (including thermoplastic vulcanizates), thermoplastic polyurethanes, thermoplastic copolyesters, and the like, and combinations thereof. Elastomers include natural rubber, polybutadienes, polyisoprenes, copolymers of isobutylene and isoprene, copolymers of styrene and butadiene (styrene-butadiene rubber), copolymers of polybutadiene and acrylonitrile), polychloroprenes, copolymers of ethylene and propylene (ethylene-propylene rubber), polysiloxanes, fluorosilicone rubbers, polyether block amides, copolymers of ethylene and vinyl acetate, and the like, and combinations thereof. Thermosets include epoxy resins, cyanate ester resins, maleimide resins, benzoxazine resins, vinylbenzyl ether resins, alkene-containing monomers, alkyne-containing monomers, arylcyclobutene resins, perfluorovinyl ether resins, oligomers and polymers with curable vinyl functionality, and the like, and combinations thereof. Polymers particularly suitable for forming the polymeric replica include polystyrene, poly(methyl methacrylate), polycarbonate, thermoplastic polyesters such as poly(ethylene terephthalate) and poly(butylene terephthalate), polyimides, and polyetherimides. The working examples below demonstrate the formation of polymeric replicas comprising polydimethylsiloxanes, poly(butylene terephthalate)s, random copolymers of tetrafluoroethylene and hexafluoropropylene, and polyimides derived from pyromellitic dianhydride and 4,4'-oxydianiline.

As noted above, one advantage of forming the block copolymer film on the polymeric replica rather than directly on the topographically patterned crystalline surface is that the polymeric replica can be flexible or even elastomeric. A flexible polymeric replica allows the use of roll-to-roll processing methods and the fabrication of curved (non-planar) high-density arrays. In some embodiments, the polymeric replica comprises a polymer has a flexural modulus of about 100 to about 10,000 megapascals, specifically 300 to 8,000 megapascals, more specifically 900 to 5,000 megapascals, measured at 23° C. according to ASTM D790-03, Procedure A.

When a solvent vapor is used to anneal the block copolymer film, the polymeric replica is preferably resistant to the annealing solvent. Thus, in some embodiments, the annealing the block copolymer film comprises annealing the block copolymer film in a vapor of an annealing solvent, and the polymeric replica comprises a polymer wherein a 100 micron thickness of the polymer is not worn through by 100 double rubs of a cloth saturated with the annealing solvent, conducted according to ASTM D5402-06, Method A.

The glass transition temperature, $T_g$, of the polymer used to form the polymeric replica can vary widely. When the polymeric replica comprises an elastomer, the $T_g$ value can be, for example, about −150 to about 0° C., specifically about −100 to about −10° C., more specifically about −50 to about −25° C. When the polymeric replica comprises a thermoplastic, the $T_g$ value can be, for example, about 25 to about 450° C., specifically about 60 to about 400° C., more specifically about 90 to about 300° C., still more specifically about 100 to about 200° C.

The method can utilize polymeric replicas with a wide range of thicknesses. In some embodiments, the polymeric replica is separated from the crystalline master prior to coating the block copolymer film on the patterned surface of the polymeric replica that was previously in contact with the crystalline master. In these embodiments, the polymeric replica should be thick enough to be physically robust to separation of the polymeric replica from the crystalline master as well as coating and annealing of the block copolymer film on the polymeric replica. Depending on the properties of the material used to form the polymeric replica, thicknesses as small as several tens of nanometers can be sufficient in these embodiments, and there is no particular upper limit on the thickness of the polymeric replica (e.g., the thickness can be 1 centimeter or greater). In other embodiments, the polymeric replica is not separated from the crystalline master prior to coating the block copolymer film, and the block copolymer film is coated on the surface of the polymeric replica opposite the topographically patterned crystalline surface of the master. In these embodiments, the polymeric replica must be so thin that each of its two main surfaces is a replica of the topographically patterned crystalline surface of the master: the replica surface in contact with the topographically patterned crystalline surface of the master is an opposing (negative) copy of the topographically patterned crystalline surface, and the replica surface opposite the topographically patterned crystalline surface (and in contact with the block copolymer film) is a direct (positive) copy of the topographically patterned crystalline surface. In other words, the polymeric replica must be a conformal coating on the topographically patterned crystalline surface. In these embodiments, the polymeric replica can have a thickness of about 2 to about 30 nanometers, specifically about 3 to about 25 nanometers. Conformal coatings can be prepared by techniques including spin coating of a monomer composition followed by polymerization, and chemical vapor deposition of a monomer composition, followed by polymerization. If necessary for structural support during processing, a supporting layer can be applied to the surface of the block copolymer film opposite the polymeric replica.

Like the topographically patterned crystalline surface from which it is prepared, the topographically patterned surface of the polymeric replica can exhibit a variety of topologies. In some embodiments, the topographically patterned surface of the polymeric replica exhibits a sawtooth pattern characterized by a peak-to-peak separation of about 24 to about 200 nanometers and a peak-to-valley separation of about 3 to about 20 nanometers. In other embodiments, the topographically patterned surface of the polymeric replica exhibits a grooved pattern characterized by a groove depth of about 3 to about 20 nanometers and a groove-to-groove separation of about 24 to about 200 nanometers.

Once the polymeric replica is formed, a block copolymer film is formed on the topographically patterned surface of the polymeric replica. In order to form at least two domains in the block copolymer film, the block copolymer should comprise at least two chemically distinct blocks. The block copolymer can be, for example, a diblock copolymer, a triblock copolymer, a tetrablock copolymer, or a radial block copolymer. There is no particular limitation on the chemical composition of the block copolymer blocks, provided that block copolymer comprises a first block and second block that are sufficiently incompatible with each other to form separate phases. Incompatibility of the two blocks can be characterized by a difference in the Hildebrand solubility parameters of the two blocks. For example, when the block copolymer comprises a first block having a first Hildebrand solubility parameter and a second block having a second Hildebrand solubility parameter, the first Hildebrand solubility parameter and the second Hildebrand solubility parameter can differ by at least 0.4 megapascal$^{1/2}$.

In some embodiments, the block copolymer comprises at least one block selected from the group consisting of polyolefins, poly(alkenyl aromatic)s, poly(conjugated dienes)s, hydrogenated poly(conjugated dienes)s, poly(vinyl-substituted nitrogen heterocycle)s, poly(alkyl (meth)acrylate)s, poly((meth)acrylic acid)s, poly(alkylene oxide)s, poly(arylene oxide)s, poly(arylene sulfide)s, poly(vinyl alkanoates), poly(vinyl ether)s, poly(vinyl halide)s, poly(vinyl alcohol)s, polyurethanes, poly(meth)acrylonitriles, polyesters, polyamides, polyimides, polycarbonates, polysulfones, and polysiloxanes.

In some embodiments, the block copolymer comprises a poly(alkenyl aromatic) block that is the polymerization product of an alkenyl aromatic monomer having the structure

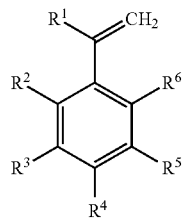

wherein $R^1$ is hydrogen or $C_1$-$C_6$ alkyl, and each occurrence of $R^2$, $R^3$, $R^4$, $R^5$, and $R^6$ is independently selected from the group consisting of hydrogen, $C_1$-$C_6$ alkyl, and halogen. In some embodiments, the block copolymer comprises a polystyrene block.

In some embodiments, the block copolymer comprises a poly(alkylene oxide) block, such as a poly(ethylene oxide) block, a poly(propylene oxide) block, or a poly(ethylene oxide-co-propylene oxide) block.

In some embodiments, the block copolymer comprises a poly(vinyl-substituted nitrogen heterocycle) block that is the polymerization product of a vinyl-substituted nitrogen heterocycle selected from the group consisting of 2-vinylpyridine, 3-vinylpyridine, 4-vinylpyridine, 2-methyl-5-vinylpyridine 1-vinylimidazole, 2-vinylimidazole, 4-vinylimidazole, N-vinyl-2-methylimidazole, N-vinyl-2-ethylimidazole, 2-vinylpyrrole, 3-vinylpyrrole, and mixtures thereof. In some embodiments, the block copolymer comprises a poly(4-vinylpyridine) block or a poly(2-vinylpyridine) block.

Suitable block copolymers used for forming the block copolymer film further include, for example, polystyrene-b-poly(4-vinylpyridine)s, polystyrene-b-poly(2-vinylpyridine)s, and polystyrene-b-poly(ethylene oxide)s.

In a specific embodiment, the block copolymer film comprises a polystyrene-b-poly(ethylene oxide) which in turn comprises a polystyrene block having a number average molecular weight of about 6,000 to about 30,000 atomic mass units and a poly(ethylene oxide) block having a number average molecular weight of about 2,000 to about 10,000 atomic mass units, wherein the ratio of the number average molecular weight of the polystyrene block to the number average molecular weight of the poly(ethylene oxide) block is about 2:1 to about 6:1.

The block copolymer can comprise the first block and the second block in a volume ratio of about 1:10 to about 10:1. In some embodiments, the block copolymer is asymmetric in that the molecular weight of the first block is substantially larger than the molecular weight of the second block. For example, the first block and the second block can differ in number average molecular weight by at least a factor of 1.5, specifically a factor of 1.5 to 6, more specifically a factor of 2 to 5, still more specifically a factor of 3 to 4.

In some embodiments, forming the block copolymer film comprises spin coating the block copolymer film from solution onto the topographically patterned surface of the polymeric replica. For example, a solution of a polystyrene-b-poly(ethylene oxide) in benzene can be spin coated onto a poly(butylene terephthalate) polymeric replica. The solvent is typically allowed to evaporate, leaving a block copolymer film free of components other than the block copolymer.

The block copolymer film typically has a thickness of about 10 to about 100 nanometers. In some embodiments, the block copolymer film has a thickness corresponding to about one period of the block copolymer. The relationship between film thickness and the period of the block copolymer can be determined using methods known in the art. See, for example, Russell, T. P.; Lambooy, P.; Barker, J. G.; Gallagher, P. D.; Satija, S. K.; Kellogg, G. J.; and Mayes, A. M. *Macromolecules* 1995, 28, 787; and Mayes, A. M.; Kumar, S. K. *MRS Bulletin* 1997, 22, 43.

Once the block copolymer film is formed, it is annealed. Annealing increases the order (regularity) of the BCP microdomain array. In some embodiments, the block copolymer film is thermally annealed. For example, when the block copolymer is a polystyrene-b-poly(n-butyl methacrylate) diblock copolymer, the block copolymer can be annealed at 170° C. for four days. In other embodiments, the block copolymer film is annealed by exposure to solvent vapors. For example, when the block copolymer is a polystyrene-poly(4-vinylpyridine) diblock copolymer, the annealing solvent vapor can comprise toluene and tetrahydrofuran. As another example, when the block copolymer is a polystyrene-b-poly(ethylene oxide), the annealing solvent vapor can comprise o-xylene.

Once the block copolymer film is annealed, a nanopatterned surface has been created. However, further processing steps can, optionally, be employed to produce intermediates in the fabrication of articles such as polarizers, templates for pattern transfer to generate microelectronic integrated circuits, magnetic media, and optical waveguides. For example, the method can further include surface reconstructing the annealed block copolymer film. The surface reconstruction method is described in Xu, T.; Hawker, C. J.; and Russell, T. P. *Advanced Functional Materials* 2003, 13, 698 and typically consists of exposing the annealed block copolymer film to a solvent that preferentially dissolves the minor phase of the block copolymer film and effects transfer of that phase to the surface of the film opposite the polymeric replica. It is important to note that no chemical bonds are broken in the surface reconstruction process and that the process is reversible (for example, by the application of heat). Surface reconstruction is conducted at a temperature below the glass transition temperature of the major (matrix) phase of the block copolymer film, so that the structure of the film is conserved in that the spaces formerly occupied by the minor phase are converted to voids. For example, when the minor phase consists of cylinders perpendicular to the plane of the film, surface reconstruction results in migration of the minor phase to the top surface of the film and formation of cylindrical voids where the minor phase formerly resided. The cylindrical voids extend from the substrate surface through the major phase-containing layer and the minor phase-containing layer to the top of the block copolymer film. As another example, when the minor phase consists of lines parallel to the plane of the film, surface reconstruction results in the migration of the minor phase to the top surface of the film and formation of linear voids (troughs or trenches) where the minor phase formerly resided.

The method can, optionally, further comprise coating an etch-resistant material onto the surface-reconstructed block copolymer film to form a resist-coated block copolymer film. Techniques for coating an etch-resistant material are known in the art and described, for example, in copending U.S. Patent Application Ser. No. 61/098,253 filed Sep. 19, 2008. The etch-resistant layer can be coated using various methods known in the art, including, for example, evaporating, sputtering, chemical vapor deposition (CVD), and metalorganic chemical vapor deposition (MOCVD). The etch-resistant layer will generally include at least one material that is more etch-resistant than the block copolymer film. Suitable materials include metals, such as iron, ruthenium, osmium, cobalt, nickel, palladium, platinum, copper, silver, gold, and the like, and alloys of the foregoing. When the etch-resistant layer comprises a metal, the etch-resistant layer can be formed by evaporating the metal and allowing the evaporated metal to deposit on the top surface of the block copolymer film. In some embodiments, including those embodiments in which subsequent etching of the substrate is intended, it is desirable to avoid depositing etch-resistant material into the voids formed on surface reconstruction. In these embodiments, the etch-resistant material is deposited from a glancing angle relative to the plane of the block copolymer film. In other embodiments, it is desirable to deposit etch-resistant material into the voids formed on surface reconstruction so that the etch-resistant material is deposited through the voids onto the polymer replica surface. In these embodiments, the etch-resistant material is deposited from an angle approximately normal to the plane of the block copolymer film. Although the term "etch-resistant layer" is used, coating the etch-resistant material need not be followed by an etching step. For example, when the surface reconstructed block copolymer film defines a hexagonal array of cylindrical pores and the etch-resistant material is a magnetic material that is deposited from an angle approximately normal to the plane of the polymeric replica, coating of the etch resistant layer can be followed by separation of the block copolymer layer from the polymeric replica, yielding a polymeric replica decorated with a hexagonal array of magnetic islands.

The resist-coated block copolymer film can, optionally, be further processed via etching to form voids in the polymeric replica corresponding to the cylinders of the surface-reconstructed block copolymer film. Suitable etching methods include for example, dry chemical etching, wet chemical etching, plasma etching, reactive ion etching, micromachining, electron beam writing, laser micromachining, ablation, ion beam milling, and the like. In some embodiments, reactive ion etching is used. Suitable precursors for reactive ion etching include, for example, tetrafluoromethane, fluorotrichloromethane, and antimony hexafluoride. In some embodiments, etching the resist-coated block copolymer film comprises reactive ion etching using a tetrafluoromethane precursor. The resulting nanopatterned polymeric replica can be separated from the etch-resistant layer and the block copolymer film. This separation step can, for example, comprise contacting the etched article with a solution capable of dissolving or solubilizing the etch-resistant layer. For example, when the etch-resistant layer comprises gold, suitable solutions include aqueous solutions comprising potassium iodide and iodine, and aqueous solutions comprising cyanide ion. In some embodiments, the separation step comprises using a so-called lift-off method to swell the block copolymer layer and separate it and the overlying etch-resistant layer from the etched polymeric replica. Solvents suitable for use in a lift-off method include any solvent or solvent mixture capable of swelling the block copolymer but not irreversibly harming the polymeric replica. For example, when the block copolymer is a polystyrene-b-poly(4-vinylpyridine), suitable solvents include toluene, tetrahydrofuran, chloroform, dimethylformamide, dimethylacetamide, and the like, and mixtures thereof. The lift-off method can, optionally, comprise agitation or sonication to facilitate separation of the swollen block copolymer layer from the polymeric replica. In some embodiments, separating the etch-resistant layer and the block copolymer film from the nanopatterned polymeric replica comprises contacting the etched article with an aqueous solution comprising potassium iodide and iodine.

Another use of the method is to prepare arrays of magnetic materials on a polymeric replica. For example, when the surface-reconstructed block copolymer film defines a hexagonal array of cylindrical voids extending (perpendicular to and) through the surface-reconstructed block copolymer film, a magnetic material can be coated onto and from directly above the surface reconstructed block copolymer film so that it at least partially fills the voids defined by the surface reconstructed block copolymer film (and, optionally, projecting into the polymeric replica). Suitable magnetic materials include, for example, nickel, cobalt, chromium, and alloys of iron and platinum. Once the magnetic material has been coated, the magnetically decorated polymeric replica can be separated from the block copolymer film using, for example, a lift-off method.

In a very specific embodiment of the method, the forming a polymeric replica comprises contacting a surface of a poly (butylene terephthalate) film with an annealed surface of a single crystal aluminum oxide substrate, wherein the contacting is conducted at a temperature of about 180 to about 210° C.; the annealed surface of the single crystal aluminum oxide (and the topographically patterned surface of the polymeric replica) comprises a sawtooth pattern characterized by a peak-to-peak separation of about 70 to about 200 nanometers and a peak-to-valley separation of about 5 to about 20 nanometers; the forming a block copolymer film comprises (after separating the poly(butylene terephthalate) replica from the single crystal aluminum oxide) forming a polystyrene-b-poly (ethylene oxide) film on the topographically patterned surface of the poly(butylene terephthalate) replica; the polystyrene-poly(ethylene oxide) diblock copolymer film has a thickness of about 10 to about 50 micrometers; the annealing the block copolymer film comprises annealing the polystyrene-b-poly(ethylene oxide) film in o-xylene vapor; and the annealed block copolymer film comprises a hexagonal array of cylindrical poly(ethylene oxide) microdomains.

One embodiment is a method of forming a nanopatterned surface, comprising: forming a block copolymer film on a topographically patterned surface of a polymer layer; wherein the topographically patterned surface of the polymer layer is formed in contact with a topographically patterned crystalline surface; and annealing the block copolymer film to form an annealed block copolymer film comprising a nanopatterned surface.

The invention extends to article formed using the method. For example, one embodiment, corresponding to the "polymeric replica" of the method, is a polymer layer comprising a topographically patterned surface formed in contact with a topographically patterned surface of a single crystal substrate; wherein the topographically patterned surface of the single crystal substrate is a substantially planar surface at least one degree removed from any crystallographic plane of the single crystal substrate. The polymer layer can comprise a single topographically patterned surface, as in embodiments in which the polymer layer is separated from the topographically patterned crystalline surface prior coating of the block copolymer film. Alternatively, the polymer layer can comprise two topographically patterned surfaces, as in the embodiments in which the polymer layer corresponds to a conformal coating on the topographically patterned crystalline surface.

Another embodiment is a layered article, comprising: a single crystal substrate comprising a topographically patterned surface, wherein the topographically patterned surface is a planar surface at least one degree removed from any crystallographic plane of the single crystal substrate; and a polymer layer comprising a topographically patterned surface in contact with (e.g., entirely in contact with and opposing) the topographically patterned surface of the single crystal substrate. The polymer layer of the layered article can comprise a single topographically patterned surface, as in embodiments in which the polymer layer is separated from the topographically patterned crystalline surface prior coating of the block copolymer film. Alternatively, the polymer layer of the layered article can comprise two topographically patterned surfaces, as in the embodiments in which the polymer layer corresponds to a conformal coating on the topographically patterned crystalline surface.

Another embodiment is a layered article, comprising: a polymer layer comprising a topographically patterned surface formed in contact with a topographically patterned surface of a single crystal substrate, wherein the topographically patterned surface of the single crystal substrate is a substantially planar surface at least one degree removed from any crystallographic plane of the single crystal substrate; and a block copolymer film comprising a surface in contact with (e.g., entirely in contact with and opposing) the patterned surface of the polymer layer. In this layered article, the block copolymer film can be, for example, an annealed block copolymer film, or an annealed and solvent-reconstructed block copolymer film.

The invention includes at least the following embodiments.

Embodiment 1: A method of forming a nanopatterned surface, comprising: forming a polymeric replica of a topographically patterned crystalline surface; wherein the polymeric replica comprises a topographically patterned surface opposing the topographically patterned crystalline surface; forming a block copolymer film on the topographically patterned surface of the polymeric replica; and annealing the block copolymer film to form an annealed block copolymer film comprising a nanopatterned surface.

Embodiment 2: The method of embodiment 1, wherein the annealed block copolymer film comprises a hexagonal array of cylindrical microdomains.

Embodiment 3: The method of embodiment 2, wherein the hexagonal array of cylindrical microdomains exhibits an orientation order of at least 0.9 over an area of at least 1 centimeter$^2$.

Embodiment 4: The method of embodiment 2 or 3, wherein the hexagonal array of cylindrical microdomains exhibits an orientation order greater than that of the polymeric replica.

Embodiment 5: The method of any of embodiments 2-4, wherein the cylindrical microdomains are separated by a nearest-neighbor distance of about 10 to about 100 nanometers.

Embodiment 6: The method of any of embodiments 1-5, wherein the forming a polymeric replica comprises contacting a polymer film comprising a polymer having a glass transition temperature, $T_g$, with the topographically patterned crystalline surface at a temperature greater than $T_g$.

Embodiment 7: The method of embodiment 6, wherein the polymer has a melting temperature, $T_m$, and wherein the contacting the polymer film with the topographically patterned crystalline surface is conducted at a temperature less than $T_m$.

Embodiment 8: The method of any of embodiments 1-7, wherein the patterned surface of the polymeric replica comprises a sawtooth pattern characterized by a peak-to-peak separation, $L_R$; wherein the block copolymer film comprises a hexagonal array of cylindrical microdomains characterized by a nearest-neighbor micro domain separation, $L_{BCP}$; and wherein $L_R/L_{BCP}$ has a value of about 1 to about 10.

Embodiment 9: The method of any of embodiments 1-5, wherein the forming a polymeric replica comprises polymerizing a monomer composition in contact with the topographically patterned crystalline surface.

Embodiment 10: The method of any of embodiments 1-5, wherein the forming a polymeric replica comprises reacting a first polymer in contact with the topographically patterned crystalline surface to form a second polymer in contact with the topographically patterned crystalline surface.

Embodiment 11: The method of any of embodiments 1-10, wherein the polymeric replica comprises a polymer selected from the group consisting of polydimethylsiloxanes, poly (butylene terephthalate)s, random copolymers of tetrafluoroethylene and hexafluoropropylene, and polyimides derived from pyromellitic dianhydride and 4,4'-oxydianiline.

Embodiment 12: The method of any of embodiment 1-11, wherein the polymeric replica comprises a polymer having a flexural modulus of about 100 to about 10,000 megapascals measured at 23° C. according to ASTM D790-03, Procedure A.

Embodiment 13: The method of any of embodiments 1-12, wherein the topographically patterned surface comprises a sawtooth pattern characterized by a peak-to-peak separation of about 24 to about 200 nanometers and a peak-to-valley separation of about 3 to about 20 nanometers.

Embodiment 14: The method of any of embodiments 1-12, wherein the topographically patterned surface comprises a grooved pattern characterized by a groove depth of about 3 to about 20 nanometers and a groove-to-groove separation of about 24 to about 200 nanometers.

Embodiment 15: The method of any of embodiments 1-14, wherein the topographically patterned crystalline surface is an annealed surface of a single crystal aluminum oxide substrate.

Embodiment 16: The method of any of embodiments 1-15, wherein the topographically patterned crystalline surface is a substantially planar surface of a single crystal substrate; wherein the substantially planar surface is at least one degree removed from any crystallographic plane of the single crystal substrate.

Embodiment 17: The method of any of embodiments 1-16, wherein the block copolymer film comprises a block copolymer selected from the group consisting of polystyrene-b-poly (4-vinylpyridine)s, polystyrene-b-poly(2-vinylpyridine)s, and polystyrene-b-poly(ethylene oxide)s.

Embodiment 18: The method of any of embodiment 1-17, wherein the block copolymer film comprises a polystyrene-b-poly(ethylene oxide); wherein the polystyrene-b-poly(ethylene oxide) comprises a polystyrene block having a number average molecular weight of about 6,000 to about 30,000 atomic mass units and a poly(ethylene oxide) block having a number average molecular weight of about 2,000 to about 10,000 atomic mass units; and wherein a ratio of the number average molecular weight of the polystyrene block to the number average molecular weight of the poly(ethylene oxide) block is about 2:1 to about 6:1.

Embodiment 19: The method of any of embodiments 1-18, wherein the block copolymer film has a thickness of about 10 to about 100 nanometers.

Embodiment 20: The method of any of embodiments 1-19, wherein the block copolymer film comprises a polystyrene-b-poly(ethylene oxide); and wherein the annealing the block copolymer film comprises exposing the block copolymer film to an annealing solvent vapor comprising o-xylene.

Embodiment 21: The method of any of embodiments 1-21, further comprising surface reconstructing the annealed block copolymer film.

Embodiment 22: The method of embodiment 1, wherein the forming a polymeric replica comprises contacting a surface of a poly(butylene terephthalate) film with an annealed surface of a single crystal aluminum oxide substrate, wherein the contacting is conducted at a temperature of about 180 to about 210° C.; wherein the annealed surface of the single crystal aluminum oxide comprises a sawtooth pattern characterized by a peak-to-peak separation of about 70 to about 200 nanometers and a peak-to-valley separation of about 5 to about 20 nanometers; wherein the forming a block copolymer film comprises forming a polystyrene-b-poly(ethylene oxide) film on the topographically patterned surface of the poly (butylene terephthalate) replica; wherein the polystyrene-poly(ethylene oxide) diblock copolymer film has a thickness of about 10 to about 50 micrometers; wherein the annealing the block copolymer film comprises annealing the polystyrene-b-poly(ethylene oxide) film in o-xylene vapor; and wherein the annealed block copolymer film comprises a hexagonal array of cylindrical poly(ethylene oxide) microdomains.

Embodiment 23: A method of forming a nanopatterned surface, comprising: forming a block copolymer film on a topographically patterned surface of a polymer layer; herein the topographically patterned surface of the polymer layer is formed in contact with a topographically patterned crystalline surface; and annealing the block copolymer film to form an annealed block copolymer film comprising a nanopatterned surface.

Embodiment 24: A polymer layer comprising a topographically patterned surface formed in contact with a topographically patterned surface of a single crystal substrate; wherein the topographically patterned surface of the single crystal substrate is a substantially planar surface at least one degree removed from any crystallographic plane of the single crystal substrate.

Embodiment 25: A layered article, comprising: a single crystal substrate comprising a topographically patterned surface; wherein the topographically patterned surface is a planar surface at least one degree removed from any crystallographic plane of the single crystal substrate; and a polymer layer comprising a topographically patterned surface in contact with the topographically patterned surface of the single crystal substrate.

Embodiment 26: A layered article, comprising: a polymer layer comprising a topographically patterned surface formed in contact with a topographically patterned surface of a single crystal substrate; wherein the topographically patterned surface of the single crystal substrate is a substantially planar surface at least one degree removed from any crystallographic plane of the single crystal substrate; and a block copolymer film comprising a surface in contact with the patterned surface of the polymer layer.

Embodiment 27: The layered article of embodiment 26, wherein the block copolymer film is an annealed block copolymer film.

Embodiment 28: The layered article of embodiment 26, wherein the block copolymer film is an annealed and solvent-reconstructed block copolymer film.

The invention is further illustrated by the following non-limiting examples.

EXAMPLES

Preparation of Polymeric Replicas

The following examples illustrate the formation of polymeric replicas of a topologically patterned crystalline surface using four different polymeric materials. Two of the replicas are formed by softening a pre-existing polymer layer while it is in contact with a crystalline master surface. A third replica is formed by creating a polymeric layer from a monomer mixture in contact with the crystalline master surface. And a fourth replica is formed by converting a precursor polymer in contact with the crystalline master surface to a product polymer in contact with the crystalline master surface.

Preparation of miscut sapphire masters. Miscut C-plane sapphire (miscut inclination angle of several degree towards the [1 $\bar{1}$00] direction) was annealed in air at 1373 K (1100° C.) for 10 hours. M-plane sapphire, which is not a miscut surface but is instead an unstable plane formed at temperatures over 1200° C., was formed by heating a sapphire wafer in air at 1300 to 1500° C. for 24 hours to form self-generated sawtooth patterns. Typically, such annealed sapphire substrates exhibit a sawtooth topography with a peak-to-valley separation of about 10 nanometers and average peak separation distance ranging from about 70 to about 200 nanometers.

Preparation of a PDMS Replica. A commercially available polydimethylsiloxane (PDMS) precursor, SYLGARD 184, was used to produce a polymeric replica having faceted patterns, where the pitch and the amplitude are 130 nanometers and 14 nanometers, respectively. The PDMS precursor was cast on top of a sawtooth-patterned sapphire surface master, then cured at 40° C. for 4 hours, and cooled to room temperature. Finally, the PDMS polymeric replica was peeled off of the sapphire master. An atomic force microscopic (AFM) image of the patterned surface of the PDMS polymeric replica is shown in FIG. 1(A). The pitch (peak-to-peak distance) and amplitude (peak-to-valley height) of the polymeric replica were the same as those of the sapphire master.

Preparation of FEP and PBT Replicas. Preparation of polymeric replicas using fluorinated ethylene-propylene copolymer (FEP) and poly(butylene terephthalate (PBT) replica was conducted by contacting a 30 micrometer thick layer of the respective polymer with a sawtooth-patterned sapphire surface master for 10 minutes in a 200° C. oven. The 200° C. temperature is a temperature greater than the FEP and PBT glass transition temperatures and less than the FEP and PBT melting temperatures. A pressure of about 200 kilopascals was applied to press the polymer layer and sapphire master together while they were heated at 200° C. The resulting structures with contacting sapphire surface and polymeric replica surface were cooled to room temperature, and the polymeric replicas, each having a thickness of about 30 micrometers, were separated from the sapphire masters. Although not utilized in these experiments, it would be possible to employ a thin layer of release agent between the crystalline master and the polymer layer to facilitate their separation. AFM images of the patterned surfaces of the FEP and PBT polymeric replicas are shown in FIGS. 1(B) and (D), respectively. The pitches (peak-to-peak distances) and amplitudes (peak-to-valley heights) of the polymeric replicas were the same as those of the sapphire master.

Preparation of a Polyimide Replica. Pyromellitic dianhydride-4,4'-oxydianiline (PMDA-ODA) films were prepared by spin-coating the precursor poly(amic acid) dissolved in N-methylpyrrolidinone onto a sawtooth-patterned sapphire surface master. Solvent was evaporated and the poly(amic acid) ester was converted to the polyimide by heating the structure under nitrogen to 300° C. for 3 hours. After cooling the resulting structure to room temperature, a polyimide film having a thickness of about 10 to 100 micrometers was easily peeled off. An AFM image of the patterned surface of the polyimide replica is shown in FIG. 1(C). The pitch (peak-to-peak distance) and amplitude (peak-to-valley height) of the polymeric replica were the same as those of the sapphire master.

Preparation of Highly-Ordered Block Copolymer Arrays

Figure 2:
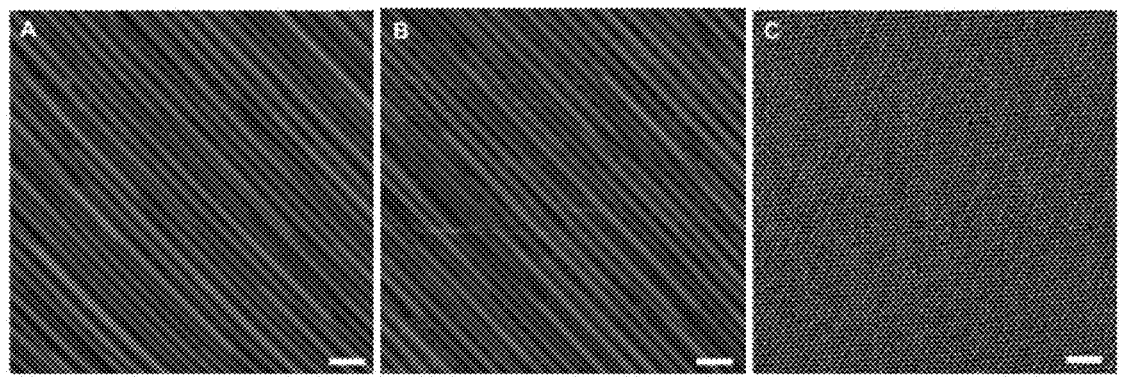
FIG. 2 consists of AFM images of (A) a surface of an annealed sapphire master, (B) a PBT replica of the sapphire surface, and (C) a solvent-annealed polystyrene-b-ethylene oxide) (PS-b-PEO) thin film prepared on the surface of the PBT replica; the scale bars are 200 nanometers.
Figure 3:
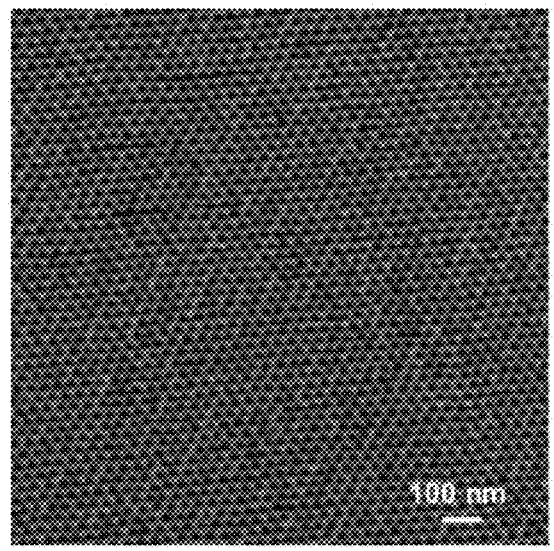
FIG. 3 is a magnified AFM image of a portion of the solvent-annealed PS-b-PEO surface shown in FIG. 2(C).

Preparation of Highly-ordered PS-b-PEO Cylindrical Microdomains on a PBT replica. FIG. 2 shows AFM images of (A) a surface of an annealed sapphire master, (B) a PBT replica of the sapphire surface, and (C) a solvent-annealed polystyrene-b-poly(ethylene oxide) (PS-b-PEO) thin film prepared on the surface of the PBT replica. In this study, PBT was used to form the polymeric replica due to its mechanical properties, resistance to the organic solvent used for block copolymer film annealing, and high melting temperature. FIG. 2(A) is an AFM image of a sawtooth-patterned sapphire surface (prepared as described above). FIG. 2(b) is an AFM image of the corresponding PBT replica surface (prepared as described above). Both the sapphire surface and the replica surface have a pitch of 80 nanometers and an amplitude of 9 nanometers. The quality of polymeric replica is the same as that of sapphire patterns. FIG. 3 is a magnified AFM image of a portion of the solvent-annealed PS-b-PEO surface shown in FIG. 2(C) (i.e., the topographically patterned surface of the polymeric replica is a high-fidelity (negative) replica of the topographically patterned surface of the crystalline master).

These experiments used a PS-b-PEO having a polystyrene block number average molecular weight of about 7,000 to 100,000 atomic mass units and a poly(ethylene oxide) block number average molecular weight of about 2,000 to about 35,000 atomic mass units. To form a block copolymer layer on the polymeric replica, PS-b-PEO was first dissolved in benzene at room temperature to form a 0.7 to 1 weight percent block copolymer solution. A PS-b-PEO thin film was prepared by spin-coating the block copolymer solution copolymer onto the patterned surface of the polymeric replica. A block copolymer film thickness of approximately 2 to 3 times greater than the patterned surface amplitude was typically used. The film thickness was controlled by varying the block polymer solution concentration (0.7-1 weight percent) and the spinning speed (2500-3500 rotations per minute). Solvent annealing of the block copolymer film was performed in an o-xylene vapor environment. To prevent dewetting during solvent annealing, a pre-swelling of polymer film in water (0 2 milliliter) vapor was performed for 1 hour, followed by solvent annealing under o-xylene (0.3 milliliter) vapor environment, all at room temperature. The PEO cylindrical microdomains of the solvent-annealed PS-b-PEO film exhibit a high degree of lateral order as shown in the AFM image of the annealed PS-b-PEO film presented in FIG. 2(C).

Figure 4:
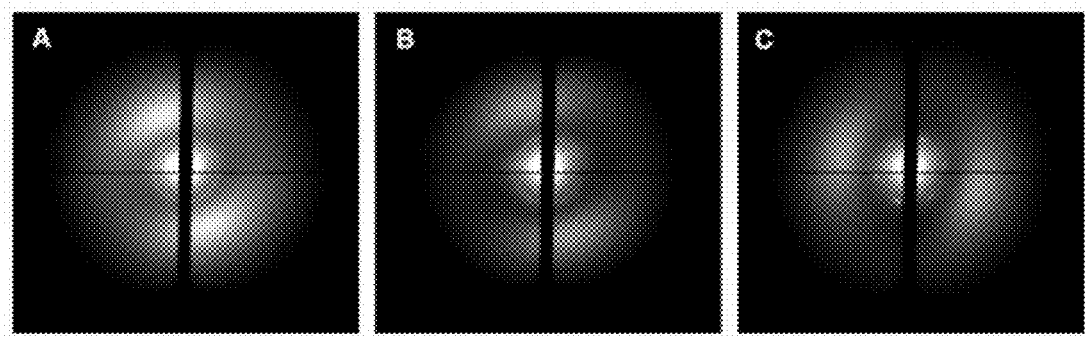
FIG. 4 shows transmission SAXS results for PS-b-PEO films on PBT as a function of solvent annealing times of (A) one hour, (B) two hours, and (C) three hours.
Figure 5:
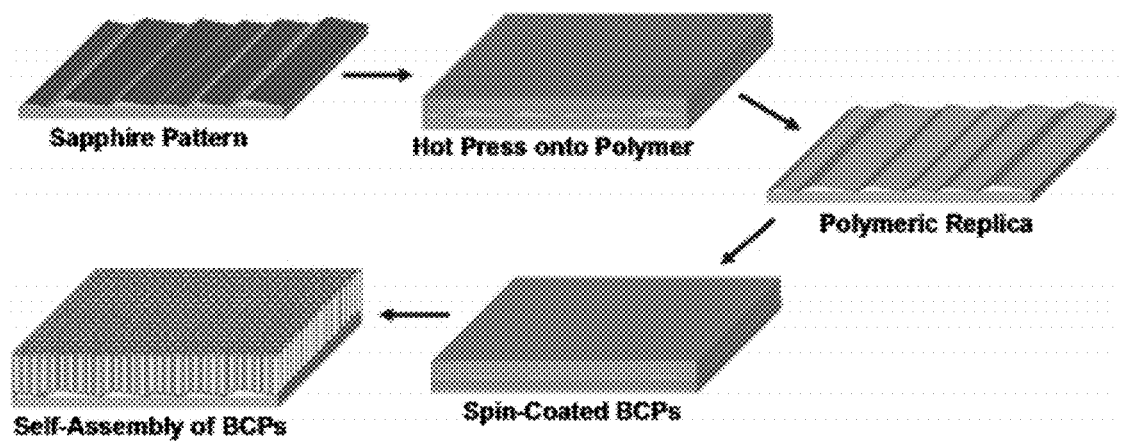
FIG. 5 illustrates formation of the polymeric replica by contacting a polymer film ("polymer") with a topographically patterned substrate ("sapphire pattern") at elevated temperature ("hot press onto polymer"), removing the topographically patterned substrate to reveal a polymeric replica with topographically patterned surface, spin-coating a block copolymer film ("spin-coated BCPs") on the topographically patterned surface of the polymeric replica, and annealing the block copolymer film ("self-assembly of BCPs").

Two-dimensional transmission small-angle X-ray scattering (SAXS) was used to further characterize the highly ordered microdomain arrays on flexible PBT substrates. In this method, the x-ray beam can penetrate the plastic substrate with minimal absorption, whereas sapphire or metallic substrates cannot be used. Transmission SAXS measurements were carried out at the synchrotron SAXS facility of Lawrence Berkeley National Laboratory. Scattering profiles were obtained at room temperature and then corrected for absorption and air scattering. Transmission SAXS results as a function of annealing time are presented in FIG. 4 for annealing times of (A) one hour, (B) two hours, and (C) three hours. As the solvent annealing time increases, the lateral ordering of cylindrical microdomains in PS-b-PEO is significantly enhanced. The films annealed for 3 hours in o-xylene vapor show six-point spots, which are long-range order characteristics over a 0.5 millimeter×1.6 millimeter area. The results shown in FIG. 4 also point to a very useful aspect of the polymeric substrate, namely that the substrate does not absorb all the photons. Consequently, in addition to grazing-incidence small-angle x-ray scattering (GISAXS), transmission SAXS can also be used to characterize the lateral ordering of BCP micro domains.

The working examples collectively demonstrate a simple process for fabrication of polymeric replicas from a patterned crystalline surface, and preparation of large-area, highly-ordered arrays of block copolymer microdomains on the polymeric replicas. The large-area, highly-ordered arrays of block copolymer microdomains can be used as templates or scaffolds for metal evaporation or loading with magnetic and/or optical materials.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The invention claimed is:

1. A layered article, comprising:
a polymer layer comprising a topographically patterned surface formed by contact with a topographically patterned surface of a single crystal substrate; wherein the topographically patterned surface of the single crystal substrate is a substantially planar surface at least one degree removed from any crystallographic plane of the single crystal substrate; and
a block copolymer film comprising a surface in contact with the patterned surface of the polymer layer; wherein the block copolymer film consists of a block copolymer selected from the group consisting of polystyrene-b-poly(4-vinylpyridine)s, polystyrene-b-poly(2-vinylpyridine)s, and polystyrene-b-poly(ethylene oxide)s wherein the block copolymer film is an annealed block copolymer film and the annealed block copolymer film comprises a hexagonal array of cylindrical microdomains.

2. The layered article of claim 1, wherein the hexagonal array of cylindrical microdomains exhibits an orientation order of at least 0.9 over an area of at least 1 centimeter$^2$.

3. The layered article of claim 1, wherein the hexagonal array of cylindrical microdomains exhibits an orientation order greater than that of the topographically patterned surface of the polymer layer.

4. The layered article of claim 1, wherein the cylindrical microdomains are separated by a nearest-neighbor distance of about 10 to about 100 nanometers.

5. The layered article of claim 1, wherein the topographically patterned surface of the polymer layer comprises a sawtooth pattern characterized by a peak-to-peak separation, $L_R$; wherein the block copolymer film comprises a hexagonal array of cylindrical microdomains characterized by a nearest-neighbor microdomain separation, $L_{BCP}$; and wherein $L_R/L_{BCP}$ has a value of about 1 to about 10.

6. The layered article of claim 1, wherein the topographically patterned surface of the polymer layer comprises a sawtooth pattern characterized by a period of about 24 to about 200 nanometers and an amplitude of about 3 to about 20 nanometers.

7. The layered article of claim 1, wherein the topographically patterned surface of the polymer layer comprises a grooved pattern characterized by a groove depth of about 3 to about 20 nanometers and a groove-to-groove separation of about 24 to about 200 nanometers.

8. The layered article of claim 1, wherein the block copolymer film is an annealed and solvent-reconstructed block copolymer film.

9. The layered article of claim 1,
wherein the block copolymer film comprises a polystyrene-b-poly(ethylene oxide);
wherein the polystyrene-b-poly(ethylene oxide) comprises a polystyrene block having a number average molecular weight of 6,000 to 30,000 atomic mass units and a poly(ethylene oxide) block having a number average molecular weight of 2,000 to 10,000 atomic mass units; and
wherein a ratio of the number average molecular weight of the polystyrene block to the number average molecular weight of the poly(ethylene oxide) block is 2:1 to 6:1.

10. The layered article of claim 1, wherein the block copolymer film has a thickness of about 10 to about 100 nanometers.

* * * * *